United States Patent [19]

Frieling et al.

[11] Patent Number: 4,494,015
[45] Date of Patent: Jan. 15, 1985

[54] PULSE ENHANCEMENT CIRCUIT FOR DIGITAL INTEGRATED CIRCUIT

[75] Inventors: Focko Frieling, Munich; Ewald Michael, Haar; Wolfgang Nikutta, Munich, all of Fed. Rep. of Germany

[73] Assignee: Siemens Aktiengesellschaft, Berlin and Munich, Fed. Rep. of Germany

[21] Appl. No.: 347,031

[22] Filed: Feb. 8, 1982

[30] Foreign Application Priority Data

Feb. 12, 1981 [DE] Fed. Rep. of Germany ....... 3105147

[51] Int. Cl.³ .................... H03K 5/01; H03K 5/02; H03K 5/135
[52] U.S. Cl. ................................ 307/268; 307/264; 307/269; 307/449; 307/482
[58] Field of Search ............... 307/264, 270, 449, 463, 307/482, 578, 268, 269; 363/59, 60; 365/230

[56] References Cited

U.S. PATENT DOCUMENTS 4,330,719  5/1982  Nagami ........................... 307/578 X
4,382,194  5/1983  Nakano et al. ................. 307/482 X
4,398,100  8/1983  Tobita et al. .................... 307/482 X

FOREIGN PATENT DOCUMENTS 2828822  2/1981  Fed. Rep. of Germany .
55-136723 10/1980 Japan .
2026742  2/1980  United Kingdom .

Primary Examiner—Larry N. Anagnos
Attorney, Agent, or Firm—Herbert L. Lerner; Laurence A. Greenberg

[57] ABSTRACT

Integrated digital MOS-semiconductor circuit, including a first circuit part for generating charging and switching pulses, a second circuit part having an input connected to the first circuit part for being addressed by the pulses supplied by the first circuit part, first, second and third self-locking MOS-field effect transistors each having a source, a drain and a gate electrode, first and second capacitors having first and second terminals, the first terminal of the first capacitor being connected through the first transistor to the input of the second circuit part, the first terminal of the second capacitor being connected through the second transistor to the input of the second circuit part, a first supply potential source at reference potential, a second supply potential source different from reference potential being connected to at least one terminal of the third transistor and through the third transistor to the first terminal of the second capacitor, the second supply potential source also being connected to the gate electrode of the first transistor, the gate of the second transistor being connected between the first transistor and the first terminal of the first capacitor, means for supplying a first digital pulse having a given beginning and end to the second terminal of the first capacitor, and means for supplying a second digital pulse having a given beginning and end to the second terminal of the second capacitor, the first and second digital pulse simultaneously ending with the pulse supplied by the first circuit part, the beginning of the pulse supplied by the first circuit part occurring earlier than the beginning of the first and second digital pulses, and the beginning of the second digital pulse occurring at least as late as the beginning of the first digital pulse.

4 Claims, 6 Drawing Figures

PULSE ENHANCEMENT CIRCUIT FOR DIGITAL INTEGRATED CIRCUIT

The invention relates to an integrated digital semiconductor circuit with a circuit portion serving for the generation of charging and switching pulses.

In German Published, Non-Prosecuted Application DE-OS No. 28 28 822 corresponding to British Pat. No. 2,026,742, a digital semiconductor circuit of at least two circuit portions with one chain each of identical storage cells serving for receiving and transmitting digital information is described in which the chains of storage cells are controlled by a common clock generator. In the above semiconductor circuit, the chain of storage cells of a first circuit portion is coupled to a signal generator which if triggered, each emit a digital pulse in such a manner that the signal generator, upon reaching a predetermined definite digital state of its chain of storage cells, emits a digital pulse; further, amplitude modulation of the sequence of clock signals generated by the common signal generator is caused by the digital pulse emitted by the signal generator; and finally, the clock signal modulated in this manner is fed to the second circuit portion through a signal identification circuit which responds to the modulation. Furthermore, if the modulation is present, the circuit corrects the digital operating state of the chain of storage cells of the second circuit portion.

It is evident that in such a circuit, besides pulses with logic states "0" to "1", there also occur synchronizing pulses with increased amplitudes which are detected by means of the above-mentioned signal recognition system. However, there are still other problems, for which the solution of, pulses with increased amplitude are desirable.

When addressing dynamic digital semiconductor memories with single-transistor memory cells of the MOS-type, there are provided word lines assigned to the individual rows as well as bit lines associated with the individual columns, for addressing the individual memory elements which are arranged in the form of a matrix on the surface of the silicon chip containing the memory. While the individual storage cells, each including a transfer transistor and a storage capacitor connected in series therewith, are connected to the bit line through the drain of the respective transfer transistor, the individual storage cells are connected to the respective word line through the gate of the corresponding MOS-field effect transfer transistor of the storage cells. For fast, effective addressing, a fast, and if possible, a complete generation of the charging state of the respectively addressed word line or bit line, defining the logic level "1", is therefore desirable. It therefore appears advisable to accomplish the addressing with increased charging pulses as the addressing signals. However, the presence of control pulses with an amplitude that is increased over the digital pulses otherwise used in the circuit can also be advantageous in other cases in digital MOS-semiconductor circuits, because advantages over the customary circuits can also be achieved then, either in the interest of identification or in the interest of a higher charging rate.

It is accordingly an object of the invention to provide an integrated digital semiconductor circuit, which overcomes the hereinafore-mentioned disadvantages of the heretofore-known devices of this general type, and which may be provided at low cost, for increasing such charging and addressing pulses, which is suitable particularly for use in dynamic digital MOS-semiconductor circuits, particularly for dynamic RAM-memories as well.

With the foregoing and other objects in view there is provided, in accordance with the invention, an integrated digital MOS-semiconductor circuit, comprising a first circuit part for generating charging and switching pulses, a second circuit part having an input connected to the first circuit part for being addressed by the pulses supplied by the first circuit part, first, second and third latching MOS-field effect transistors each having a source, a drain and a gate electrode, first and second capacitors, each having first and second terminals, the first terminal of the first capacitor being connected through the first transistor to the input of the second circuit part, the first terminal of the second capacitor being connected through the second transistor to the input of the second circuit part, a first supply potential source at reference (ground) potential, a second supply potential source different from reference potential, being connected to at least one terminal of the third transistor and through the third transistor to the first terminal of the second capacitor, the second supply potential source also being connected to the gate electrode of the first transistor, the gate of the second transistor being connected between the first transistor and the first terminal of the first capacitor, means for supplying a first digital pulse having a given beginning and end to the second terminal of the first capacitor, and means for supplying a second digital pulse having a given beginning and end to the second terminal of the second capacitor, the first and second digital pulses simultaneously ending with the pulse supplied by the first circuit part, the beginning of the pulse supplied by the first circuit part occuring earlier in time than the beginning of the first and second digital pulses, and the beginning of the second digital pulse occuring at least as late as or not before the beginning of the first digital pulse.

In accordance with another feature of the invention, the gate and drain electrodes of the third transistor are connected to the second supply potential source.

In accordance with a further feature of the invention, there is provided a fourth MOS-field effect transistor being of the same type as the first, second and third transistors and having a source, a drain and a gate electrode, and a third capacitor having first and second terminals, the drain and gate electrodes of the fourth transistor being connected to the drain of the third transistor, the source electrode of the fourth transistor being connected to the gate electrode of the third transistor and to the first terminal of the third capacitor, and means for supplying a precharging pulse to the second terminal of the third capacitor, the precharging pulse differing from or not coinciding with the control pulse supplied by the first circuit part.

In accordance with an added feature of the invention, there is provided a circuit point or node connected between the first terminal of the third capacitor and the source electrode of the fourth transistor, the gate electrode of the third transistor being connected to and exclusively controlled through the circuit node.

In accordance with an additional feature of the invention, there are provided two further MOS-field effect transistors being connected between the second supply potential source and the gate of the first transistor, each further transistor having source, drain and gate electrodes and being of the same type as the first, second and third transistors, and another capacitor connected between the gate and drain electrodes of the first transistor, the gate electrode of the first transistor being connected to the source terminals of the two further transistors and to the gate of one of the two further transistors, and the drain electrodes of the two further transistors and the gate electrode of the other of the two further transistors being connected to the second supply potential source.

In accordance with a concomitant feature of the invention, a third circuit part being connected to the first circuit part and controlled by the pulses supplied by the first circuit part, the third circuit part including the pulse supplying means for the capacitors, an inverter having an input connected to the first circuit part and being controlled by the pulses supplied by the first circuit part and an output connected to the second terminal of the third capacitor, and first, second, third and fourth pairs of latching ("self-locking") MOS-field effect transistors being connected in parallel with each other, each pair having a circuit node or point connected between the transistors thereof, the transistors of the pairs having gates, source-drain paths connected in series with each other with a first transistor connected to the second supply potential source and a second transistor connected to the first supply potential source, the gate of the first transistor of the first pair being connected to the first circuit part and controlled by the pulses supplied by the first circuit part, the gate of the second transistor of the first pair being connected to the output of the inverter, the gate of the second transistor of the second pair being connected to the node of the first pair, the gate of the first transistor of the second pair being connected to the output of the inverter, the node of the second pair being connected to the second terminal of the first capacitor and to the gate of the first transistor of the third pair, the gate of the first transistor of the fourth pair and the second transistor of the third pair being connected to the output of the inverter, the gate of the second transistor of the fourth pair being connected to the node of the third pair, and the node of the fourth pair being connected to the second terminal of the second capacitor.

Other features which are considered as characteristic for the invention are set forth in the appended claims.

Although the invention is illustrated and described herein as embodied in an integrated digital semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
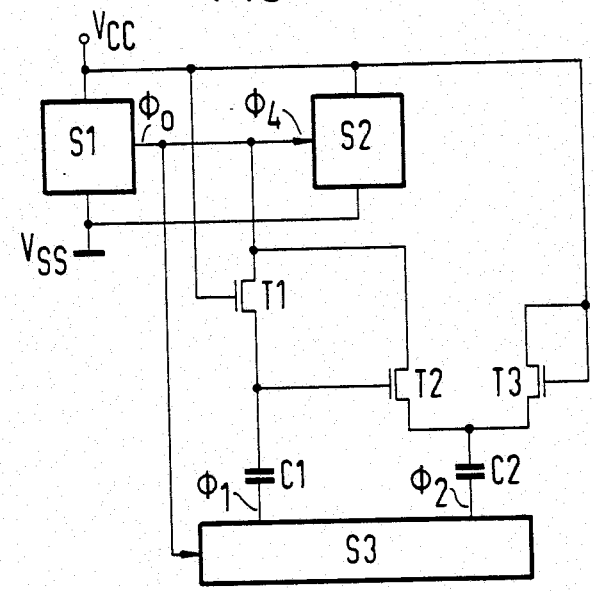
FIG. 1 is a schematic and block diagram of a relatively simple embodiment of the invention.
Figure 2:
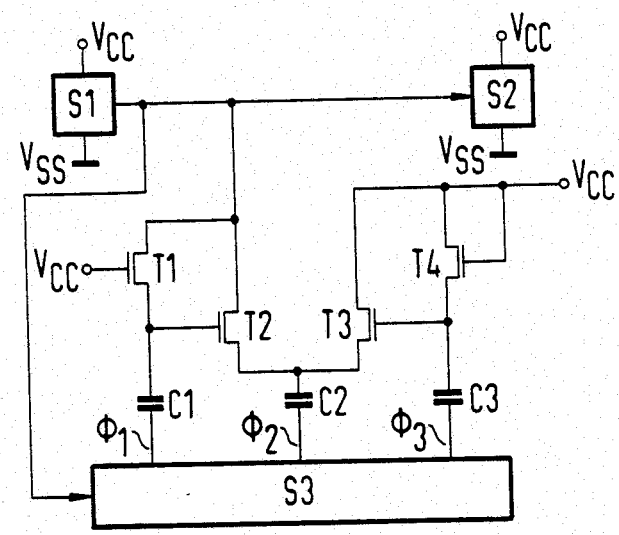
FIGS. 2 and 3 are views similar to FIG. 1 of improved embodiments of the invention.

Referring now to the figures of the drawing, first the semiconductor circuit according to the invention as shown in FIGS. 1 and 2, will be considered in particular.

A first circuit part S1 which supplies pulses $\phi_0$ to be increased, is connected to the input of a second circuit part S2 which is to be controlled by these pulses. For instance, the first circuit part S1 may represent an addressing decoder and the second circuit part S2 a word line of a dynamic RAM-memory which is to be addressed. A first MOS-field effect transistor T1 is connected with its drain to a connecting line carrying the pulse $\phi_0$ between the first circuit part S1 and the second part S2. A second MOS-field effect transistor T2 of the same type as the transistor T1 is likewise connected with its drain to the control input of the circuit part S2, and is therefore also connected to the drain of the first MOS-transistor T1. The gate of the first MOS-transistor T1 is connected to the second supply potential $V_{CC}$, and is also connected to the two circuit parts S1 and S2 and is used therein in accordance with the circuit construction of these two circuit parts. A second supply potential $V_{ss}$ is provided as reference potential, which is connected to ground. The control pulses $\phi_0$ are supplied by the circuit part S1, and are referenced to the first supply potential $V_{ss}$. The gate of the second MOS-transistor T2 is connected to the source terminal of the first MOS-transistor T1.

The capacitors C1 and C2, which, according to the definition of the invention, are each connected to a terminal of a third circuit part S3 serving as a further pulse supply source. The third circuit part S3 in turn is controlled by means of the pulse $\phi_0$ to be increased, i.e. by the signal output of the first circuit part S1. This third circuit part S3 supplies, at one output thereof, a first pulse $\phi_1$ upon receipt of each pulse $\phi_0$, to the first capacitor C1. Therefore, the first pulse $\phi_1$ is also supplied to the source of the MOS-transistor T1 as well as to the gate of the MOS-transistor T2, through the first capacitor C1. The third circuit part S3 also supplies, at a second output thereof, a pulse $\phi_2$ upon receipt of each pulse $\phi_0$, which is fed through the second capacitor C2 to the source terminal of the second MOS-transistor T2 and to the source terminal of a third MOS-transistor T3 of the same type as the transistors T1 and T2. The drain terminal and the gate terminal of the third MOS-field effect transistor T3 are connected together to the first supply potential $V_{CC}$. In order to obtain the desired effect, it is necessary that the supply potential, provided for supplying the three MOS-transistors T1, T2 and T3, not be the first reference potential $V_{ss}$.

In the embodiment of the invention shown in FIG. 2, a third capacitor C3 and a fourth MOS-transistor T4 are provided in addition to the above-mentioned circuit parts seen in FIG. 1. The third capacitor C3 is connected to one output of the third circuit part S3, which delivers a pulse $\phi_3$, still to be defined, through the capacitor C3 to the source terminal of the fourth MOS-transistor T4, as well as to the gate of the third MOS-transistor T3, and operates differently than the circuit according to FIG. 1. Furthermore, the gate and drain of the fourth MOS-transistor T4, together with the drain of the third MOS-transistor T3, are connected to the second supply potential $V_{CC}$.

Figure 4:
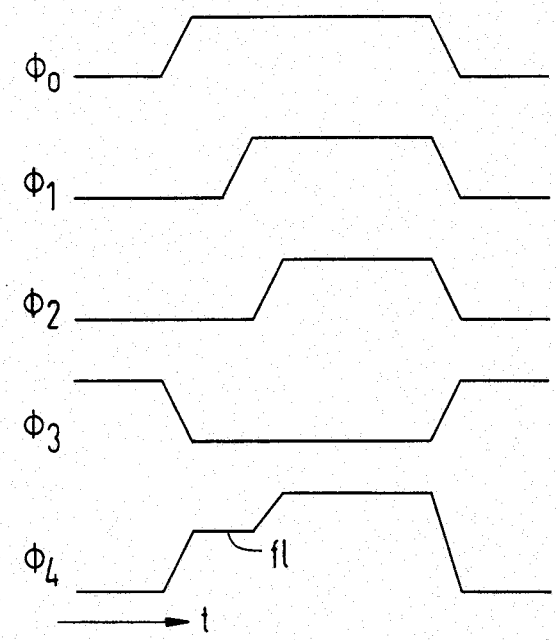
FIG. 4 is a timing diagram of the digital pulses to be used including the pulse resulting for the input of the second circuit part.

The waveform of the pulses $\phi_0$, $\phi_1$, $\phi_2$ and $\phi_3$ as well as the waveform of the pulse $\phi_4$ formed by their interaction at the input of the second circuit part S2, is shown in FIG. 4.

First, the operation of the circuit according to FIG. 2 will be discussed, from which the operation of the simplified embodiment according to FIG. 1 follows directly. It should also be mentioned that the MOS-transistors used are of the same channel type and are latching or self-locking.

As can be seen from FIG. 4, the rising edge of the pulse $\phi_1$ is located later in time than the rising edge of the trigger pulse $\phi_0$, and preferably earlier in time than the rising edge of the pulse $\phi_2$, while the falling edges of these pulses are coincident in time. Furthermore, the pulse $\phi_3$, which is to be applied to the third capacitor C3, is inverted relative to the control pulse $\phi_0$ supplied by the first circuit part S1.

The time behavior of the control pulses to be used for controlling the circuit according to FIG. 2, as seen from FIG. 4, leads to the following behavior in the circuit according to the invention as shown in FIG. 2.

Immediately prior to the start of the active operating phase of the circuit, the terminal for the pulse $\phi_3$ which enables the gate of the third MOS-transistor T3 through the third capacitor C3, is disconnected (open). This is done for the purpose of preventing a loss of charge by the precharging transistor T3 during a phase of the pulse $\phi_4$ which has increased amplitude and which is supplied in combination by the first circuit part and the circuit part constituting the invention. With the arrival of the pulse $\phi_0$, and therefore the starting phase of the pulse $\phi_4$, the first capacitor C1 is charged through the first transistor T1. In order to synchronize the beginning of the increased phase pulse $\phi_4$, which arrives at the input of the second circuit part S2, with the beginning of the shift pulse $\phi_2$, the gate of the second MOS-transistor T2 is already previously supplied with the pulse $\phi_1$ through a boot-strap capacitance, i.e. through the first capacitor C1.

During the time between the beginning of the first pulse $\phi_1$ applied to the capacitor C1, and the occurence of the second pulse $\phi_2$ applied to the capacitor C2, the drain terminals of the two MOS-transistors T1 and T2 are in a floating state, which is therefore also the case with the output of the circuit part according to the invention, and is indicated in the diagram according to FIG. 4 by the symbol "fl" (=floating state). With the occurence of the rising edge of the pulse $\phi_2$ fed through the second capacitor C2, the desired increase of the pulse signal $\phi_4$, fed to the input of the second circuit part S2, takes place due to the effect of this pulse.

After the end of the active phase of the circuit part according to the invention, the precharging pulse $\phi_3$ which is supplied through the capacitor C3, is connected again, whereby the gate voltage at the third MOS-transistor T3 is increased. In this way, the second capacitor C2 can again be precharged to the supply voltage $V_{CC}$.

With the arrival of the next pulse $\phi_0$ supplied by the first circuit part S1, the hereinafore-described process is repeated.

In the simplified embodiment according to FIG. 1, the same effect is obtained in spite of the absence of the capacitor C3 and the pulse $\phi_3$. The third MOS-transistor T3 in this case causes a precharge of the second capacitor C2 to the potential $V_{CC}-U_T$, where $U_T$ is the threshold voltage (voltage drop) of the transistor T3. This voltage drop is unavoidable and affects only the maximum value reached in the increased phase for the amplitude of the pulse $\phi_4$ arriving at the input of the second circuit part S2.

In the circuit according to the invention shown in FIG. 2, however, a still higher value for the amplitude of the pulse $\phi_4$ arriving at the input of the second circuit part S2 is reached, than is the case in the simpler embodiment according to FIG. 1 due to the presence of the capacitor C3 and the fourth MOS-transistor T4.

In comparison to the conventional devices for obtaining an increased amplitude of control pulses, the first circuit part, supplying the pulses $\phi_0$ due to the construction proposed by the invention, is not loaded by the shift effect causing the increase, which advantageously manifests itself in the form of a steeper rising edge of the pulse $\phi_4$ arriving at the second circuit part S2, and in the form of a decrease of the current peaks which automatically occur in such pulse-increase circuits. If the variant embodiment shown in FIG. 2 is used, the capacitor C2 is furthermore charged to the full $V_{CC}$ level, which leads to an amplitude increase of the control pulse to be transmitted to the second circuit part S2, that is unattainable in the known devices.

The circuit shown in FIGS. 1 and 2 can be further simplified in its operation, if the pulse $\phi_1$ governing the control of the first capacitor C1 is also fed to the second capacitor C2. In this way, the generation of the second pulse $\phi_2$ is eliminated. On the other hand, however, this causes a disadvantage in the form of a lengthening of the floating state fl of the pulse $\phi_4$ and accordingly an additional delay for the occurence of the desired increase.

In the practical manufacture of the circuit in monolithic integration with the circuit parts S1, S2 and S3 as well as other circuit parts which form the core proper of the integrated circuit, such as the matrix of a dynamic RAM-memory, the capacitors C1, C2, etc. are advantageously provided in a well known manner as MOS-capacitors. The use of gate electrodes formed of doped polycrystalline silicon in MOS-transistors of the enhancement type, i.e. latching MOS-transistors, leads, as is well known, to a reduction of the cut-off voltage $U_T$. For this reason, and also for other reasons, it is advisable to provide the transistors used in silicon-gate technology, if a circuit according to FIG. 1 is used.

Figure 3:
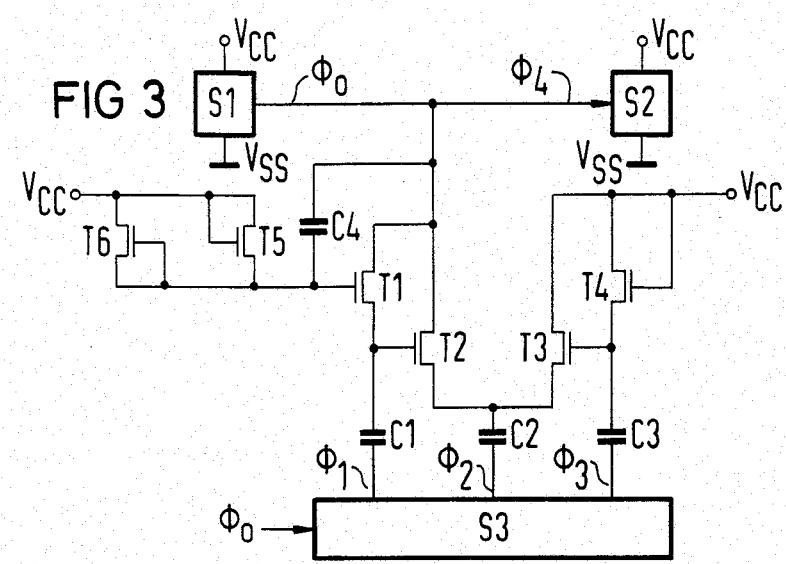

Each of the circuits for obtaining pulses with increased amplitude shown in FIG. 1 or FIG. 2, respectively, can advantageously be supplemented in the manner shown in FIG. 3 with respect to the gate control of the first MOS-field effect transistor T1. As can be seen in FIG. 3, the second supply potential $V_{CC}$ is no longer applied directly to the gate of the first MOS-transistor T1 of the circuit, but is applied through two further MOS-field effect transistors T5 and T6 of the same type as the MOS-transistors introduced thus far. The gate and the drain of the transistor T5 as well as the drain of the transistor T6 are directly connected to a supply terminal having the supply potential $V_{CC}$, while the source terminals of the two MOS-transistors T5 and T6 and the gate of the transistor T6 are connected to the gate of the first MOS-transistor T1. The gate of the first transistor T1 is furthermore connected to its drain terminal, and therefore to the output of the circuit part constituting to the invention, through a fourth capacitor C4.

Due to the presence of the just described control circuit for the gate of the first MOS-transistor T1 of the shift circuit according to the invention, the latter becomes practically insensitive to process related fluctuations of the cut-off voltage of the transistors. This is because an increase of the set-in voltage $U_T$ through the coupling of the leading edge of the pulse $\phi_4$ to be generated, causes an increase of the precharge of the gate of the first MOS-field effect transistor T1 through the capacitor C4, since the fifth transistor T5 limits the effective charging voltage to $V_{CC}+U_T$. In this way, the first capacitor C1 is precharged more highly and the gate of the second MOS-transistor T2 of the circuit is boot-strapped more heavily in the shift phase.

The first circuit part S1 which is responsible for generating the control pulses $\phi_0$, and the second circuit part S2 which is to be enabled by the increased pulse $\phi_4$ that is obtained due to the circuit according to the invention, are regarding these the invention, so that details in this regard are not required. If the invention is intended for a dynamic memory of the construction discussed at the outset, the second circuit part S2 can be provided, for instance, in the form of a word line of a dynamic MOS-semiconductor memory, which is then coupled to the respective assigned memory cells exclusively through gate electrodes, i.e. capacitively. In the interest of using a higher cell voltage level, the increased pulse $\phi_4$ which is supplied by the circuit according to the invention, then seems to be especially advantageous. The circuit according to the invention can, for instance, be permanently assigned to the output of the first circuit part S1 supplying the pulses $\phi_0$. In other cases, it may instead be more advantageous to assign such a circuit to the load S2, such as if the pulses $\phi_0$ are supplied by several pulse sources S1.

The third circuit part S3 can also be constructed in a conventional manner. To give an example for such a circuit part which is suitable for controlling a circuit according to FIG. 1 or FIG. 2, reference is made to FIG. 5. A second embodiment is shown in FIG. 6.

Figure 5:
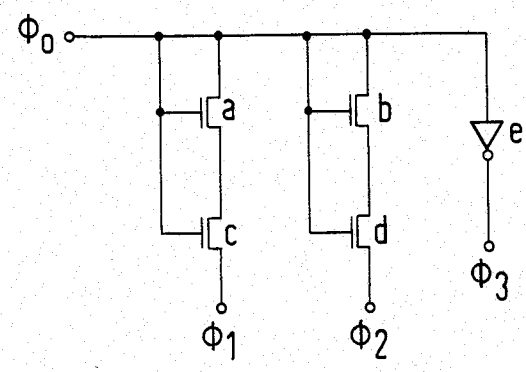
FIGS. 5 and 6 are schematic diagrams of two possible circuits for generating the further pulses required for controlling the circuit.

In the embodiment of the circuit part S3 shown in FIG. 5, there is provided a series circuit of two latching MOS-field effect transistors of the same type for generating the pulses $\phi_1$, and a corresponding combination of two further MOS-transistors for generating the pulses $\phi_2$.

For generating the pulses $\phi_1$, the pulses $\phi_0$ supplied by the circuit part S1 are fed to the gate of the two MOS-transistors "a" and "c", which are connected in series with respect to their source-drain paths; the drain of the first transistor "a" being likewise controlled by these pulses $\phi_0$. The pulse $\phi_1$ can be taken off at the source of the transistor "c". The connection of the two MOS-transistors "b" and "d" which serve for generating the pulses $\phi_2$, corresponds completely to the circuit of the transistors "a" and "b". The desired signal $\phi_2$ can be taken off at the source of the transistor "d", while the gates of the two transistors "b" and "d" as well as the drain of the transistor "b" are connected to the pulse $\phi_0$. In order to obtain the waveform of the rising edge of the pulse $\phi_2$ with respect to the corresponding pulses $\phi_0$ and $\phi_1$ as shown in FIG. 4, the spacing between the source and the drain in the transistor "a" is smaller than in the transistor "b", while the two transistors "c" and "d" have equal channel lengths and therefore, contrary to the transistors "a" and "b", have exactly coincident and short delay times. For generating the pulses $\phi_3$ provided for controlling the third capacitor C3, an inverter "e" is provided, the input of which is controlled by the pulse $\phi_0$, and the output of which supplies the pulses $\phi_3$.

Figure 6:
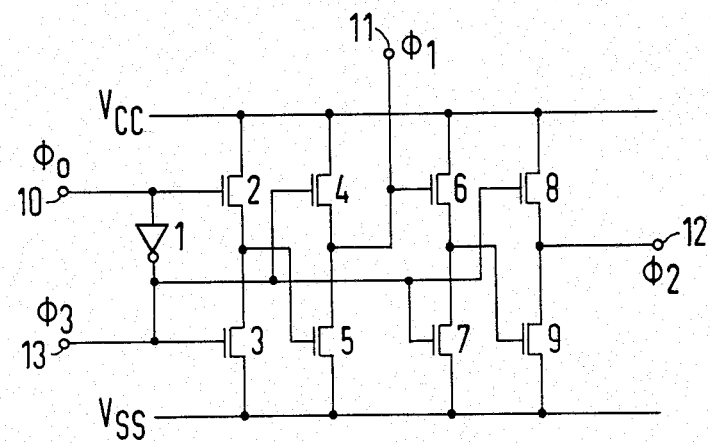

In the FIG. 6 embodiment of the circuit part S3 which serves for generating a pulse train $\phi_1$, $\phi_2$ and $\phi_3$ for controlling a circuit according to FIGS. 1 to 3, the input 10 of the circuit part S3, which is addressed by the pulses supplied by the circuit part S1, is connected to the input of an inverter 1 as well as to the gate of a first MOS-transistor 2. The output of the inverter 1 supplies the pulses $\phi_3$ to the output 13 of the circuit part S3, which can supply the pulses $\phi_3$ to be fed to the capacitor C3 in FIGS. 1 to 3. As can be seen from FIG. 6, the pulses $\phi_3$ are furthermore needed for controlling other transistors which belong to the circuit part S3 shown in FIG. 6.

The first MOS-transistor 2 which was already introduced, is connected with its drain to the second supply potential $V_{CC}$ and with its source to the drain of a second MOS-transistor 3, the source of which is connected to the reference potential $V_{ss}$, and the gate of which is connected to the output of the inverter 1 furnishing the pulses $\phi_3$. A third MOS-transistor 4 and a fourth MOS-transistor 5 are likewise connected with respect to their source-drain paths in series between the two supply potentials $V_{CC}$ and $V_{ss}$. The transistor 4 which is connected with its drain to the second supply potential $V_{CC}$ is controlled by the output of the inverter 1, and the gate of the transistor 5 which is connected with its source to the reference potential $V_{ss}$, is controlled by a circuit point between the two transistors 2 and 3 (i.e. the first and second MOS-transistors). A corresponding circuit point between the two transistors 4 and 5 leads to the output 11 supplying the pulses $\phi_1$ which serve to control the first capacitor C3 in the circuit according to FIGS. 1 to 3.

The pulses $\phi_1$ are also needed for controlling the gate of a fifth MOS-transistor 6, which is connected with its drain to the second supply potential $V_{CC}$ and with its source terminal connected through the drain-source path of a sixth MOS-transistor 7, to the reference potential $V_{ss}$. The pulses $\phi_3$ supplied by the inverter 1 are fed to the gate of the sixth MOS-transistor 7.

The pulses $\phi_3$ are also needed for controlling the gate of a seventh MOS-transistor 8 which is likewise connected with its drain to the second supply potential $V_{CC}$ and with its source terminal, on one hand through the drain-source path of an eighth MOS-transistor 9 to the reference potential $V_{ss}$, and on the other hand to the output 12 of the circuit part S3 which supplies the pulses $\phi_2$ required for controlling the second capacitor C2 of the circuit shown in FIGS. 1 to 3. The gate of the eight MOS-transistor 9 is connected to a circuit point between the two series-connected transistors 6 and 7. In the circuit shown in FIG. 6 as well, the transistors 2 to 9 are latching MOS-transistors which, for instance, are of the same channel type.

While in the embodiment of a circuit part according to FIG. 5, the waveshape of the pulses $\phi_1$ and $\phi_2$ which are to be generated, are caused by different propagation times of the transistors "a" and "b", the delay is determined in the case of the embodiment according to FIG. 6 by the choice of the transistor cut-off voltage and the node capacities.

We claim:

1. In an integrated digital MOS semiconductor circuit with a first circuit section serving as a pulse generator (S1) and a second circuit section (S2) serving as a pulse receiver, the input of which is controlled by two-level pulses supplied in part by first pulse signal ($\phi_0$) from the first circuit section, the first pulse signal being fed at the same time via the source-drain path of a first transistor (T1) to a first terminal of a first capacitor (C1) and further, via a second transistor (T2) to a first terminal of a second capacitor (C2) which is connected via a third transistor (T3) to a supply potential ($V_{CC}$) which operates together with a reference potential ($v_{SS}$) to supply the first circuit section (S1) and the second circuit section (S2), the gate of the second transistor (T2) being connected to the source terminal of the first transistor (T1) and to the first terminal of the first capacitor (C1); said transistors (T1, T2, T3) being latching MOS field-effect transistors; the second terminals of the first capacitor (C1) and of the second capacitor (C2) each receiving digital pulse signals ($\phi_1$, $\phi_2$) supplied by a third circuit section; said third circuit section being responsive to the pulse signal of said first circuit section; the pulse pulse signal $\phi_1$ being applied to the second terminal of the first capacitor (C1) and the pulse signal $\phi_2$ being applied to the second terminal of the second capacitor (C2) and wherein the pulse signal $\phi_0$ supplied by the first circuit section (S1) as well as the digital pulse signals $\phi_1$ and $\phi_2$ have simultaneous trailing edges, the leading edge of the pulse signal $\phi_0$ delivered by the first circuit section (S1) occurring before the leading edges of the pulse signals $\phi_1$ and $\phi_2$, and the leading edge of the pulse signal $\phi_2$ occurring no sooner than the leading edge of the pulse signal $\phi_1$, the improvement comprising that the gate of the first transistor (T1) is connected to the supply potential ($V_{CC}$) through two further transistors (T5, T6) of the same type as the aforesaid transistors (T1 to T3); that a third capacitor (C4) is connected between the gate and the drain of the first transistor (T1); and that the gate of the first transistor (T1) is connected to the source terminals of the two further transistors (T5, T6) and to the gate of one of said further transistors (T6), the remaining terminals of said two further transistors (T5, T6) being connected to the supply potential ($V_{CC}$).

2. Semiconductor circuit according to claim 1, wherein the third transistor (T3) is connected with its gate and with its drain directly to the supply potential ($V_{CC}$) whereby the operation of the third transistor (T3) as a resistance is achieved.

3. Semiconductor circuit according to claim 1, further comprising a fourth capacitor (C3) and a fourth transistor (T4) of the same type as the aforesaid transistors, the gate and the drain of said fourth transistor (T4) connected to the drain of the third transistor (T3), and the source terminal of the fourth transistor (T4) connected to the gate of the third transistor (T3) and to a first terminal of the fourth capacitor (C3), and the second terminal of said fourth capacitor receives a precharging pulse signal ($\phi_3$) from said third circuit section which does not coincide with the pulse signal $\phi_0$ supplied by the first circuit section (S1).

4. Semiconductor circuit according to claim 3, comprising a third circuit section being connected to said first circuit section and controlled by said pulse signal supplied by said first circuit section, said third circuit section including the means for supplying said pulse signals $\phi_1$, $\phi_2$ and $\phi_3$ to said capacitors comprising an inverter having an input connected to said first circuit section and being controlled by said pulse signal supplied by said first circuit section and an output connected to said second terminal of said fourth capacitor, and first, second, third and fourth pairs of latching MOS-field effect transistors being connected in parallel with each other, each pair having a circuit node connected between said transistors thereof, said transistors of said pairs having gates, source-drain paths connected in series with each other with a first transistor connected to said supply potential and a second transistor connected to said reference potential, the gate of said first transistor of said first pair being connected to said first circuit section and controlled by said pulses signal supplied by said first circuit section, the gate of said second transistor of said first pair being connected to the output of said inverter, the gate of said second transistor of said second pair being connected to said node of said first pair, the gate of said first transistor of said second pair being connected to the output of said inverter, said node of said second pair being connected to said second terminal of said first capacitor and the gate of said first transistor of said third pair, the gates of said first transistor of said fourth pair and said second transistor of said third pair being connected to the output of said inverter, the gate of the second transistor of said fourth pair being connected to said node of said third pair, and said node of said fourth pair being connected to said second terminal of said second capacitor.

* * * * *